United States Patent
Tera et al.

(10) Patent No.: US 7,656,622 B2
(45) Date of Patent: Feb. 2, 2010

(54) TUNNEL MAGNETORESISTANCE DEVICE WITH TUNNEL BARRIER LAYER CONTAINING RESIDUAL CARBON

(75) Inventors: Ryonosuke Tera, Toyota (JP); Inao Toyoda, Anjo (JP); Yasutoshi Suzuki, Okazaki (JP)

(73) Assignee: DENSO CORPORATION, Kariya (JP)

(*) Notice: Subject to any disclaimer, the term of this patent is extended or adjusted under 35 U.S.C. 154(b) by 408 days.

(21) Appl. No.: 11/100,616

(22) Filed: Apr. 7, 2005

(65) Prior Publication Data
US 2005/0225905 A1 Oct. 13, 2005

(30) Foreign Application Priority Data
Apr. 8, 2004 (JP) ............... 2004-114243

(51) Int. Cl.
G11B 5/39 (2006.01)
(52) U.S. Cl. ............... 360/324.2
(58) Field of Classification Search ......... 360/324.2; 428/811.1
See application file for complete search history.

(56) References Cited

U.S. PATENT DOCUMENTS

| 5,999,378 | A * | 12/1999 | Saito et al. ............... 360/324 |
| 6,483,675 | B1 | 11/2002 | Araki et al. |
| 6,617,173 | B1 | 9/2003 | Sneh |
| 2002/0055016 | A1 * | 5/2002 | Hiramoto et al. ............ 428/692 |
| 2002/0076837 | A1 | 6/2002 | Hujanen et al. |
| 2002/0177013 | A1 * | 11/2002 | Hiramoto et al. ......... 360/324.1 |
| 2003/0003635 | A1 | 1/2003 | Paranjpe et al. |
| 2003/0021908 | A1 | 1/2003 | Nickel et al. |
| 2003/0030948 | A1 * | 2/2003 | Umetsu ................ 360/324.2 |
| 2004/0062081 | A1 | 4/2004 | Drewes |
| 2004/0091744 | A1 * | 5/2004 | Carey et al. ............... 428/693 |

FOREIGN PATENT DOCUMENTS

| DE | 19938215 | 2/2001 |
| JP | 2001-36164 | 2/2001 |
| KR | 2001-0075690 | 8/2001 |
| WO | WO 02/45167 | 6/2002 |

OTHER PUBLICATIONS

Office Communication issued from Korean Patent Office dated Mar. 28, 2008 for related Korean Patent application No. 10-2005-0029162 (a English translation enclosed.).
Schwickert M M et al: "Magnetic tunnel junctions with AlN and $AlN_xO_y$ barriers" Journal of Applied Physics, vol. 89, No. 11, Jun. 1, 2001, pp. 6871-6873.
Search Report from French Patent Office dated Apr. 4, 2007 issued in corresponding France application No. 0503530.
First Office Action dated Jul. 13, 2007 in corresponding Chinese patent application No. 200510065121.5 (and English translation).

* cited by examiner

*Primary Examiner*—Craig A. Renner
(74) *Attorney, Agent, or Firm*—Posz Law Group, PLC

(57) ABSTRACT

The TMR device has a structure including a lower electrode layer, a pinned layer, a tunnel barrier layer, a free layer, and an upper electrode layer which are successively formed on a substrate. The tunnel barrier layer has substantially a stoichiometric composition. The tunnel barrier layer may be a thin film of an oxide of AL formed by ALD method.

15 Claims, 3 Drawing Sheets

TUNNEL MAGNETORESISTANCE DEVICE WITH TUNNEL BARRIER LAYER CONTAINING RESIDUAL CARBON

CROSS-REFERENCE TO RELATED APPLICATION

This application is related to Japanese Patent Application No. 2004-114243 filed on Apr. 8, 2004, the contents of which are hereby incorporated by reference.

BACKGROUND OF THE INVENTION

1. Field of the Invention

The present invention relates to a tunnel magnetoresistance device.

2. Description of Related Art

There are a variety of electronic devices that utilize the magnetoresistance effect. MRAMs (Magnetoresistive Random Access Memories), magnetic heads, and magnetic sensors head the list of such electronic devices.

Electronic devices utilizing the GMR (Giant Magnetic Resistance) effect arising from the magnetic exchange coupling between laminated magnetic thin films are also being put into commercial mass production.

Meanwhile, the TMR (Tunnel MagnetoResistance) device is expected to provide highly sensitive and highly accurate electronic devices, because the MR ratio (Magnetic Resistance change ratio) of the TMR device is far larger than that of the GMR device.

As disclosed in Japanese Patent No. 3331397, for example, the TMR device has a structure including a lower electrode layer formed on a substrate, a pinned layer (fixed magnetization layer) formed on the lower electrode layer by laminating one or more magnetic material layers, a tunnel barrier layer made of nonmagnetic insulating material formed on the pinned layer, a free layer (free magnetization layer) formed on the tunnel barrier layer, and a metal electrode layer formed on the free layer.

The direction of the electron magnetic spin in the pinned layer is fixed, while that in the free layer easily inverts depending on an external magnetic field.

With such a TMR device, since a direct tunneling current flowing through the tunnel barrier layer largely changes depending on the energy potential between the pinned layer and the free layer, it is possible to measure the external magnetic field with high precision.

The direct tunneling current is affected by the properties of the material and the thickness of the tunnel barrier layer. That is because the tunnel barrier height, which determines the intensity of the electric field within the tunnel barrier layer, depends on the properties of the material and the thickness of the tunnel barrier layer. This is explained in more detail below. The tunnel junction resistance $R\sigma$ of the TMR device is given by the following expressions (1) and (2).

$$R\sigma = C\sigma \cdot \exp(2\kappa d) \quad (1)$$

$$\kappa = (2m\phi/h^2)^{1/2} \quad (2)$$

In the above expressions, $C\sigma$ is a value depending on electron states of the tunnel barrier layer and the magnetic layers putting the tunnel barrier layer therebetween, d is a barrier thickness of the tunnel barrier layer, $\phi$ is a barrier potential height from the Fermi potential, m is the mass of electron, and h is the Planck's constant.

As is evident from the expressions (1) and (2), the tunnel junction resistance $R\sigma$ decreases exponentially with reduction of the barrier thickness (or the thickness of the tunnel barrier layer).

It is desirable to make the thickness of the tunnel barrier layer as small as possible, because the MR ratio and the tunneling current increase with reduction of the tunnel junction resistance $R\sigma$. In the TMR device, the MR ratio is defined as a tunnel junction resistance ratio between when the electron spin direction in the free layer is the same as that in the pinned layer and when the electron spin direction in the free layer is opposite to that of the pinned layer. Generally, the thickness of the tunnel barrier layer has to be smaller than 5 nm, desirably, 1 nm.

Generally, the tunnel barrier layer is a thin metal oxide film formed by a process including the steps of forming a metal film as thin as about 1 nm by PVD (Physical Vapor Deposition) method, for example, by sputter deposition, and oxidizing the formed thin metal film through heating processing, plasma processing, or air exposure in an oxidation atmosphere.

However, there is a problem in that the conventional tunnel barrier layer formed by PVD method lacks uniformity in layer thickness and layer quality.

It arises from the fact that an island-growth phenomenon easily occurs during a process of forming a thin metal film having a thickness of the order of about 1 nm, which is equivalent to the total height of several to several tens of a molecular layer, and as a result, metal clusters are scattered over the surface of the formed thin metal film.

For such reason, the thickness of the tunnel barrier layer formed by PVD method is not uniform even if the formed tunnel barrier layer is subjected to oxidizing processing. This may cause local electric field concentration, a leak current, tunneling current variation, and pinholes within the tunnel barrier layer. These significantly degrade the performance of the TMR device.

Incidentally, it is known that a lamination of a ferromagnetic film and an antiferromagnetic film has a high coercivity because of the effect of exchange coupling therebetween. Accordingly, the pinned layer, which is required to have a high coercivity, is preferably a lamination of thin metal films. However, in this case, it is very difficult to control surface roughness of the pinned layer, because the pinned layer is formed by a process including the step of forming a thin metal film. If the surface roughness of the pinned layer is large, the drapability of the tunnel barrier layer over the pinned layer is lowered.

Several measures have been proposed for providing the pinned layer having a smooth surface. Such measures include forming the pinned layer by epitaxial growth or heteroepitaxial growth so that it has nearly a monocrystal structure, and smoothing the surface of the formed pinned layer by electron beam polishing. However, it is difficult to carry out such measures from economical and technical standpoints.

Furthermore, a surface phase tends to be formed when forming a thin metal film as the tunnel barrier layer on the pinned layer due to intermetallic diffusion therebetween. Such a surface phase makes it difficult to control the layer thickness of the tunnel barrier layer.

Incidentally, the TMR device is expected to be small in size for miniaturization of electronic circuits. However, as the size of the TMR device becomes smaller, the tunneling current and sensitivity thereof becomes smaller as can be seen from the following expression (3)

$$Itun = J \cdot S \quad (3)$$

where Itun denotes a tunneling current, J denotes a density of the tunneling current, and S denotes an effective surface area of the TMR device.

Since the tunneling current is proportional to the effective surface area of the TMR device, it is possible to increase the tunneling current without increasing the surface area of the TMR device by venturing to make large the surface asperities of the pinned layer, thereby making large the effective surface area.

However, if the surface asperities of the pinned layer are made larger, the drapability of the tunnel barrier layer over the pinned layer becomes worse, and accordingly the performance of the TMR device is worsened.

SUMMARY OF THE INVENTION

The tunnel magnetoresistance device of the invention has a structure including:

a pinned layer;

a tunnel barrier layer formed on the pinned layer; and a free layer formed on the tunnel barrier layer, the tunnel barrier layer having substantially a stoichiometric composition.

The tunnel barrier layer having substantially a stoichiometric composition has good drapability over the pinned layer. Accordingly, the thickness nonuniformity of the tunnel barrier layer is very small even if it is formed thinly on the surface of the pinned layer having large surface irregularities. Hence, the TMR device according to the invention exhibits a large MR ratio because of the small thickness of the tunnel barrier layer, and also exhibits a stable tunneling current and a small leak current because of the small thickness-nonuniformity of the tunnel barrier layer.

In addition, it is also possible to make the tunneling current more larger by utilizing the surface irregularities of the pinned layer. This is based on the fact that the effective surface area of the pinned layer increases as the surface roughness of the pinned layer increases. By utilizing the surface irregularities of the pinned layer, it becomes possible to make the surface area of the TMR device smaller.

The tunnel magnetoresistance device can be manufactured by a method comprising the steps of:

forming a pinned layer on a substrate;

forming a tunnel barrier layer on the pinned layer; and forming a free layer on the tunnel barrier layer, wherein the tunnel barrier layer is formed by CVD method without being exposed to an oxidation atmosphere.

The tunnel magnetoresistance device of the invention can be manufactured by use of an apparatus comprising:

a first process chamber for forming the pinned layer;

a second process chamber for forming the tunnel barrier layer by CVD method; and a load lock chamber interconnecting the first and second process chambers, the load lock chamber allowing the substrate to be transported from the first process chamber to the second process chamber while preventing the substrate from being exposed to an oxidation atmosphere.

PREFERRED EMBODIMENTS OF THE INVENTION

Figure 1:
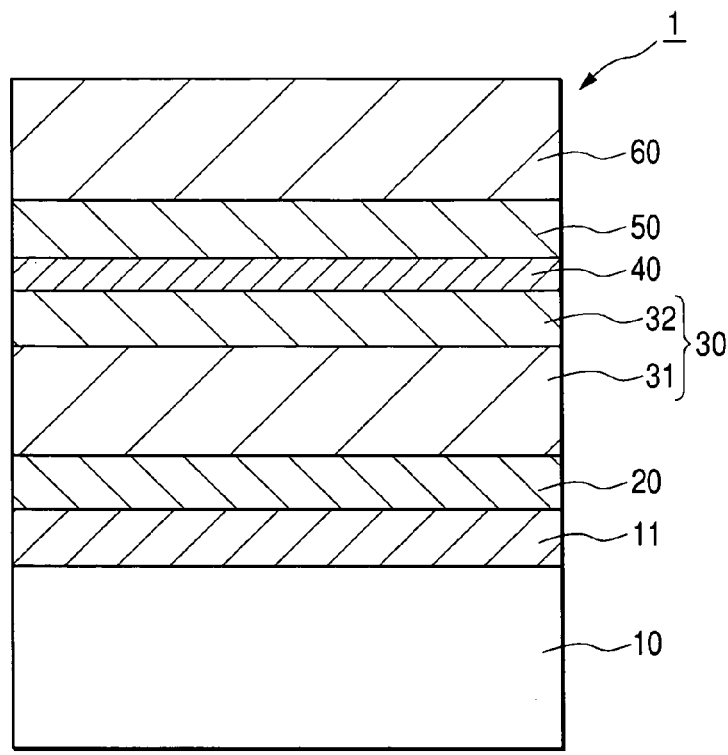
FIG. 1 is a section view of a TMR device according to an embodiment of the invention.

FIG. 1 is a section view of a TMR device 1 according to an embodiment of the invention. As shown in this figure, the TMR device 1 has a structure including a lower electrode layer 20, a pinned layer 30, a tunnel barrier layer 40, a free layer 50, and an upper electrode layer 60 successively formed on a substrate 10.

The substrate 10 may be a silicon substrate on which an insulating layer 11 is formed. The insulating layer 11 serves to electrically isolate the lower electrode layer 20 from the substrate 10.

The insulating layer 11 is a $SiO_2$ thin film having a thickness of 300 nm formed on the substrate 10 by sputtering method. It is possible to form the $SiO_2$ film by a different method, for example, by thermal oxidation of the silicon substrate 10, or by CVD (Chemical Vapor Deposition) method. The material of the insulating layer 11 is not limited to $SiO_2$.

The lower electrode layer 20 is a Cr film formed to the thickness of 30 nm on the insulating layer 11 by sputtering method. The pinned layer 30 having a total thickness of 10 nm is constituted by a lower pinnd layer 31 and an upper pinned layer 32. The lower pinned layer 31 is a thin film of PtMn that exhibits antiferromagnetism, and the upper pinned layer 32 is a thin film of NiFe that exhibits ferromagnetism.

The pinned layer 30 has a high coercivity due to the effect of exchange coupling between the ferromagnetic thin film and the antiferromagnetic thin film.

The tunnel barrier layer 40 is a thin insulating film deposited to have substantially a stoichiometric composition on the upper pinned layer 32 by the CVD method.

The CVD method is a method for forming a thin film by reacting two or more kinds of source gases in vapor phase or by reacting them near a substrate interface within a reaction chamber.

With the CVD method, it is possible to obtain a tunnel barrier layer having a higher drapability and a more uniform thickness than with the conventional PVD method. As the CVD method, thermal CVD, plasma CVD, and photo CVD are known.

In this embodiment, the ALD (Atomic Layer Deposition) method is used for forming the tunnel barrier layer 40. The ALD method, which is also called as ALE (Atomic Layer Epitaxy), or ALCVD (Atomic Layer Chemical Vapor Deposition), is a kind of CVD method.

Here, the ALD method is briefly explained below. The ALD method is a method for growing, one atomic or molecular layer at a time, a crystal of two or more kinds of raw materials (chemical elements or chemical compounds) introduced into a reaction chamber in an alternating sequence by utilizing adsorption reaction at the surface of a substrate disposed in the reaction chamber and the vapor pressure differences between the raw materials and a target material.

The ALD method is different from other methods categorized into the CVD method in that there is only a single source gas existing at a time within the reaction chamber in the ALD method.

First, a source gas (raw material gas) A is introduced, together with a carrier gas such as Ar and $N_2$, into the reaction chamber inside of which is maintained vacuum. If the substrate is maintained above a certain temperature, an atomic layer or a molecular layer of the raw material A is formed on the surface of the substrate by self-limiting adsorption.

Subsequently, the remaining source gas A is purged from the reaction chamber by use of an inert gas, and then a source gas (raw material gas) B is introduced into the reaction chamber. In consequence, an atomic layer or a molecular layer of the raw material B is formed on the atomic or molecular layer of the raw material A. After that, the remaining source gas B is purged from the reaction chamber. This cycle is repeated multiple times to form a thin film having a desired thickness on the substrata.

The ALD method includes a method using chemical elements as source gases, and a method using chemical compounds as source gases. In either method, the self limiting type adsorption such as the Langmuir-type adsorption mechanism has to be dominant as the source gas atomic or molecular adsorption mechanism.

In the Langmuir-type adsorption mechanism, the surface adsorption factor θ i of the source gas is given by the following expression (4)

$$\theta i = KaPi/(Kd+KaPi) = KPi/(1+KPi) \quad (4)$$

where Pi denotes a partial pressure of a source gas, Ka denotes an adsorption rate constant, Kd denotes a desorption rate constant, and K denotes Ka/Kd.

If Kpi is sufficiently larger than 1, or if the source gas molecules or elements exiting in vapor are in a saturated state with respect to the adsorption rate, a monoatomic or monomolecular layer is formed.

Accordingly, the surface adsorption factor in the ALD method can be as high as substantially 100%. For this reason, the ALD method is suitable for uniformly forming the tunnel barrier layer.

Furthermore, the ALD method eliminates the need of forming a metal layer on the pinned layer, and accordingly avoids metal diffusion. Accordingly, with the ALD method, it becomes possible to form the tunnel barrier layer having less thickness variation.

The tunnel barrier layer 40 may be an oxide, nitride or oxinitride of a metal (or a semiconductor), or a combination of them. More specifically, the tunnel barrier layer 40 may be a thin film made of an oxide of Al, Y, Si, Mg, Ti, Ta, W, Hf or Nb, or a combination of them.

The tunnel barrier layer 40 may be also a thin film made of an oxinitride of Al, Si, Ti or Ta, or a combination of them. Preferably, the chemical composition of the tunnel barrier layer 40 is $Al_2O_3$, $SiO_2$, $Si_3N_4$, SiON, TaON, AlON, or $Y_2O_3$.

The chemical composition of the tunnel barrier layer 40 may be WO, $Ta_2O_5$, $TiO_2$, TiON, MgO, or $Nb_2O_5$.

The thickness of the tunnel barrier layer 40 should be as small as possible for reducing the tunnel resistance. However, it is desirable that the thickness is between 0.5 nm and 1 nm from the viewpoint of offering good drapability. However, the thickness can be as large as about 5 nm depending on use conditions of the TMR device.

In a case where the tunnel barrier layer 40 is made of a thin oxide film of Al, the atomic percentage of oxygen in the tunnel barrier layer may be between 52% and 68%.

It is desirable that the residual carbon concentration in the tunnel barrier layer 40 is not higher than 1atomic %. The maximum height Rmax of roughness of the pinned layer 30 may be larger than 10 nm.

In this embodiment, the tunnel barrier layer 40 is a thin $Al_2O_3$ film formed to the thickness of 1 nm on the pinned layer by the ALD method. The free layer 50 is a thin NiFe film formed to the thickness of 100 nm on the tunnel barrier layer 40 by the sputtering method.

The upper electrode layer 60 is a thin Al film formed to the thickness of 300 nm on the free layer 50 by the sputtering method. A barrier metal may be inserted between the upper electrode layer 60 and the free layer 50.

As already explained, the principle of detecting a magnetic field by the TMR device is that the direct tunneling current flowing through the tunnel barrier layer 40 changes largely depending on the change of the energy potential between the two magnetic layers (the pinned layer 30 and the free layer 50) which is caused by the change of the magnetic spin direction in the free layer 50.

Figure 2:
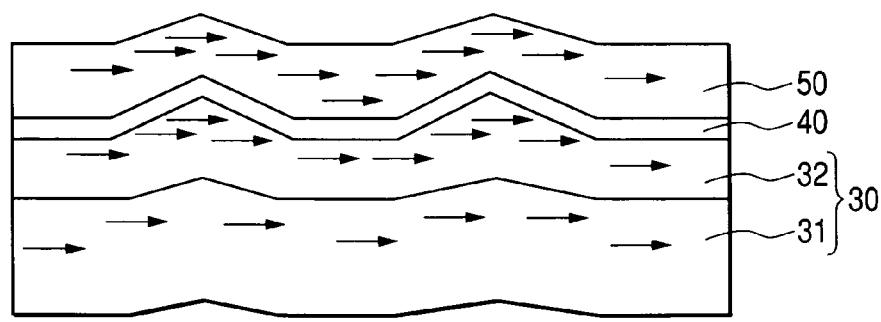
FIGS. 2 and 3 are diagrams for explaining the principle of detecting a magnetic field by the TMR device.
Figure 3:
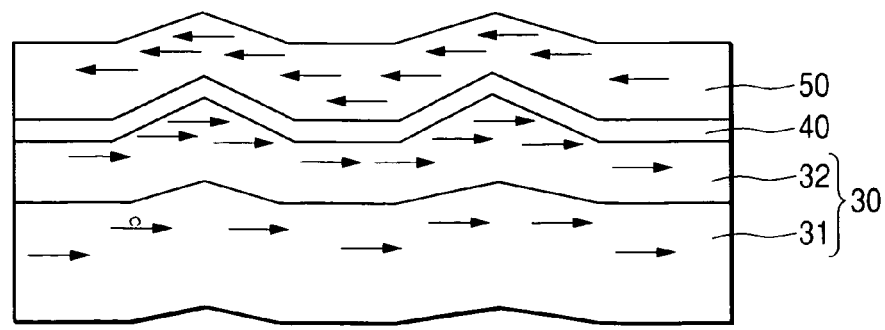

FIGS. 2 and 3 are diagrams for explaining this principle, in which the arrows indicate directions of magnetic spins. FIG. 2 shows a case where the direction of the magnetic spin in the pinned layer 30 is the same as that of the free layer 50. FIG. 3 shows a case where the direction of the magnetic spin in the pinned layer 30 is opposite to that of the free layer 50.

Next, a method of manufacturing the above described TMR device is explained.

As a first step, an $SiO_2$ film is formed to the thickness of 300 nm as the insulating layer 11 by sputtering on the substrate 10 made of silicon. Subsequently, a Cr film is formed to the thickness of 30 nm as the lower electrode layer 20 by sputtering on the insulating layer 11.

Next, the pinned layer 30 is formed to the thickness of 10 nm by sputtering on the lower electrode layer 20. More specifically, a thin film of PtMn that exhibits antiferromagnetism is formed as the lower pinned layer 31 on the lower electrode layer 20, and then a thin film of NiFe that exhibits ferromagnetism is formed as the upper pinned layer 32 on the lower pinned layer 31.

Figure 4:
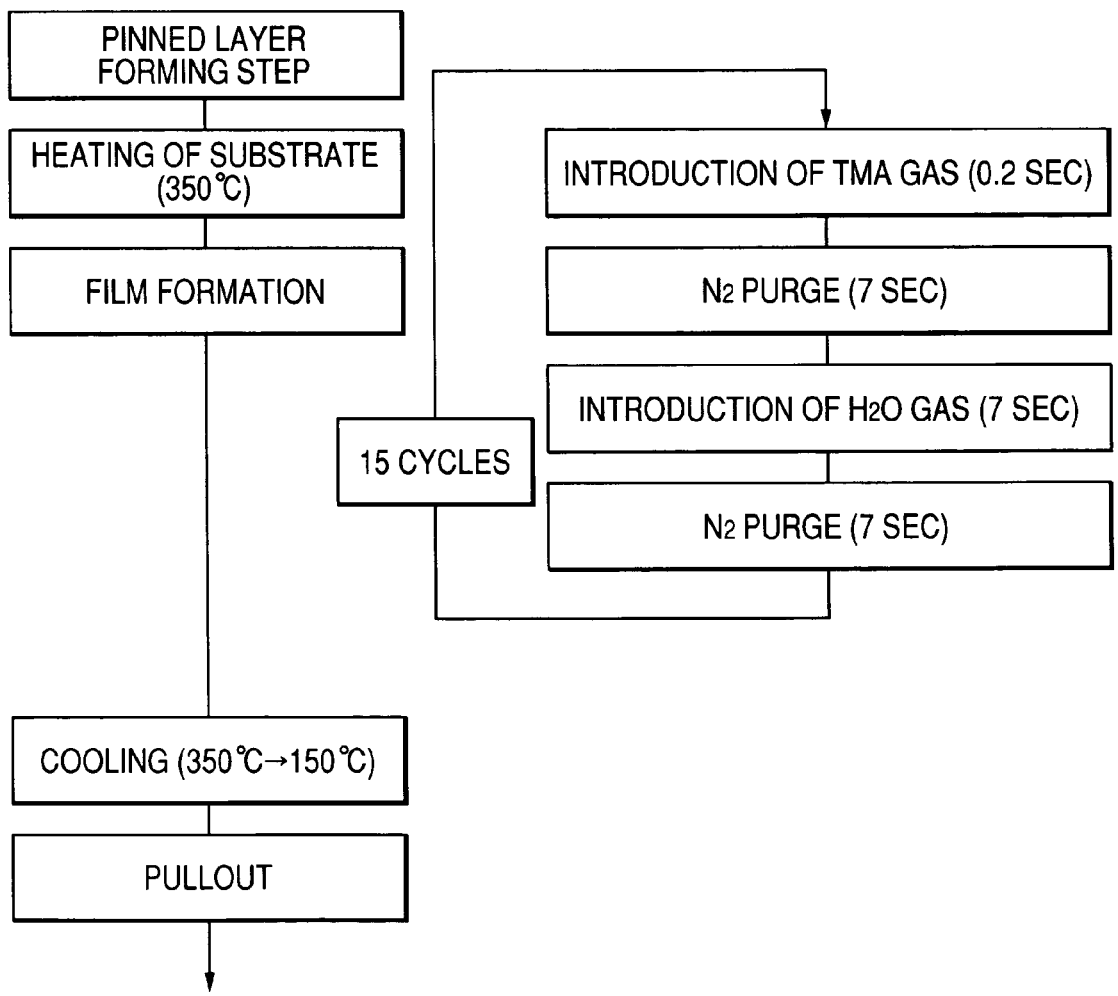
FIG. 4 is a diagram for explaining a process of forming a tunnel barrier layer of the TMR device of the invention.

After that, an $Al_2O_3$ film is formed to the thickness of 1 nm as the tunnel barrier layer 40 by the ALD method on the pinned layer 30. An example of the process of forming the $Al_2O_3$ film by the ALD method is explained below with reference to FIG. 4.

As the source gases, TMA $((CH_3)_3Al$, trimethyl aluminum) and $H_2O$ are used. The deposition conditions of the $Al_2O_3$ film are as follows.

The substrate 10 is heated to 350° C. in the reaction chamber. TMA and $H_2O$ vaporized at room temperature are introduced into the reaction chamber together with a N2 carrier gas in an alternating sequence at the rate of 400 sccm.

Also as the purge gas, the $N_2$ gas is used. The introduction time of the TMA is 0.2 sec, the purge time of the TMA is 7 sec, the introduction time of the $H_2O$ is 0.2 sec, and the purge time of the $H_2O$ is 7 sec. This cycle is repeated 15 times to form the $Al_2O_3$ film having the thickness of about 1 nm.

The deposition temperature is fixed at 350° C. After completion of the Al2O3 deposition, the substrate is self-cooled to 150° C., when it is pulled out from the reaction chamber.

Next, a NiFe film is formed to the thickness of 100 nm as the free layer 50 by sputtering on the tunnel barrier layer 40. Finally, an Al film is formed to the thickness of 300 nm as the upper electrode layer 60 by sputtering on the free layer 50. Thus, the TMR device of the invention is obtained.

Incidentally, the stoichiometric composition of the $Al_2O_3$ film formed as the tunnel barrier layer 40 can be controlled by selection of oxidizing material, and settings of the introduction times and temperatures of the source gases.

For example, although the atomic percentage of oxygen in the $Al_2O_3$ film formed by the above described process is between 52% and 60%, it can be controlled mainly by the deposition temperature. When the deposition temperature is low, the formed $Al_2O_3$ film becomes metal rich. Generally, as the deposition temperature becomes higher, the composition of the formed $Al_2O_3$ film approaches the theoretical stoichiometric ratio if the deposition temperature is lower than the decomposition temperature of the TMA.

If TMA and ozone gases are used as the source gases, a thin film made of an oxide of aluminum whose atomic oxygen percentage exceeds 60% can be obtained as the tunnel barrier layer 40.

By subjecting the formed tunnel barrier layer 40 to oxidation treatment such as thermal oxidation, plasma oxidation, and ozone oxidation, it is possible that the tunnel barrier layer 40 has an oxygen-rich composition where the atomic oxygen percentage is about 68%.

The tunnel barrier layer 40 may be a thin film made of an oxinitride of Al. In this case, an oxidizing gas such as $H_2O$ or ozone, and a nitriding gas which is typically $NH_3$ are introduced into the reaction chamber alternately. As explained above, the TMR device 1 according to this embodiment has a structure including the lower electrode layer 20, pinned layer 30, tunnel barrier layer 40, free layer 50, and upper electrode layer 60 which are successively formed on the substrate 10, in which the tunnel barrier layer 40 has substantially a stoichiometric composition.

The tunnel barrier layer 40 can be formed by the CVD method. In this embodiment, the tunnel barrier layer 40 is a thin film of an oxide of AL ($AL_2O_3$) formed to have substantially a stoichiometric composition by the ALD method.

Conventionally, the tunnel barrier layer is formed by the PVD method, and accordingly, its chemical composition is quite different from the stoichiometric composition.

The tunnel barrier layer 40 having substantially a stoichiometric composition has good drapability over the pinned layer 30. Accordingly, the thickness nonuniformity of the tunnel barrier layer 40 is very small even if it is formed thinly on the surface of the pinned layer 30 having large surface irregularities.

Hence, the TMR device according to this embodiment exhibits a large MR ratio because of the small thickness of the tunnel barrier layer, and also exhibits a stable tunneling current and a small leak current because of the small thickness-nonuniformity of the tunnel barrier layer.

In addition, it is also possible to make the tunneling current more larger by utilizing the surface irregularities of the pinned layer 30. This is based on the fact that the effective surface area of the pinned layer increases as the surface roughness of the pinned layer increases. By utilizing the surface irregularities of the pinned layer 30, it becomes possible to make the surface area of the TMR device smaller.

Generally, the maximum height Rmax of roughness of the formed pinned layer 30 is larger than 5 nm, if any surface smoothing measure such as epitaxial growth or heteroepitaxial growth is not taken when forming the pinned layer 30.

If the thickness of the lower electrode layer 20 or the lower pinned layer 32 is made large enough, the maximum height Rmax exceeds 10 nm. Even when the tunnel barrier layer 40 is formed on the pinned layer 30 having such large surface roughness, there is no fear that pinholes occur in the tunnel barrier layer 40, because of the small thickness-nonuniformity thereof ensured from the high drapability of the tunnel barrier layer 40.

It is also possible to make the surface roughness of the pinned layer 30 large by subjecting the pinned layer 30 to a photolithographic or dry etching process.

For example, the surface roughness of the pinned layer 30 can be increased by subjecting the surface of the pinned layer 30 to sputter-etching by use of Ar, or to wet-etching before forming the tunnel barrier layer 40 thereon.

Other than the above, the effective surface area of the pinned layer 30 can be increased also by the blast method or by the trench method.

Increasing the surface roughness of the pinned layer 30 is not limited to treating the surface of the pinned layer 30. If the surface of any of the lower electrode layer 20, substrate 10 and insulating layer 11 is treated to have asperities, the surface roughness of the pinned layer 30 increases, because the sizes of the asperities of the surface of the pinned layer 30 are affected by these asperities.

Figure 5:
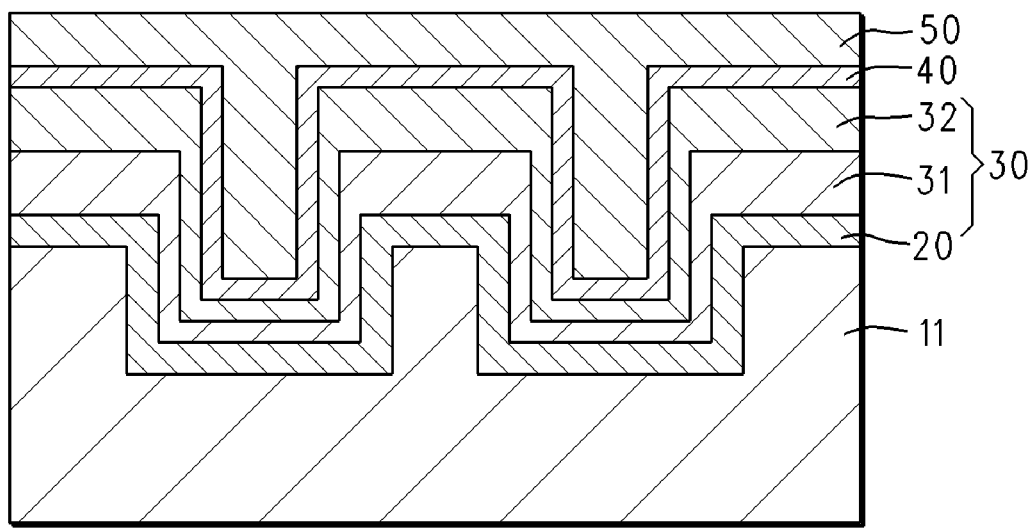
FIG. 5 is a section view of a variant of the TMR device of the invention, whose insulating layer is treated to have large surface asperities.

FIG. 5 is a section view of an example of such a TMR device in which the insulating layer 11 is treated to have large surface asperities for the purpose of increasing the surface roughness of the pinned layer.

When the tunnel barrier layer 40 is formed by the CVD method, the formed tunnel barrier layer 40 contains carbon, because organic metal (TMA in this embodiment) is used as a raw material. However, it is desirable that the residual carbon in the tunnel barrier layer 40 is not higher than 1atomic %, because if the concentration of the residual carbon is high, the leak current easily occurs in the tunnel barrier layer 40.

Figure 6:
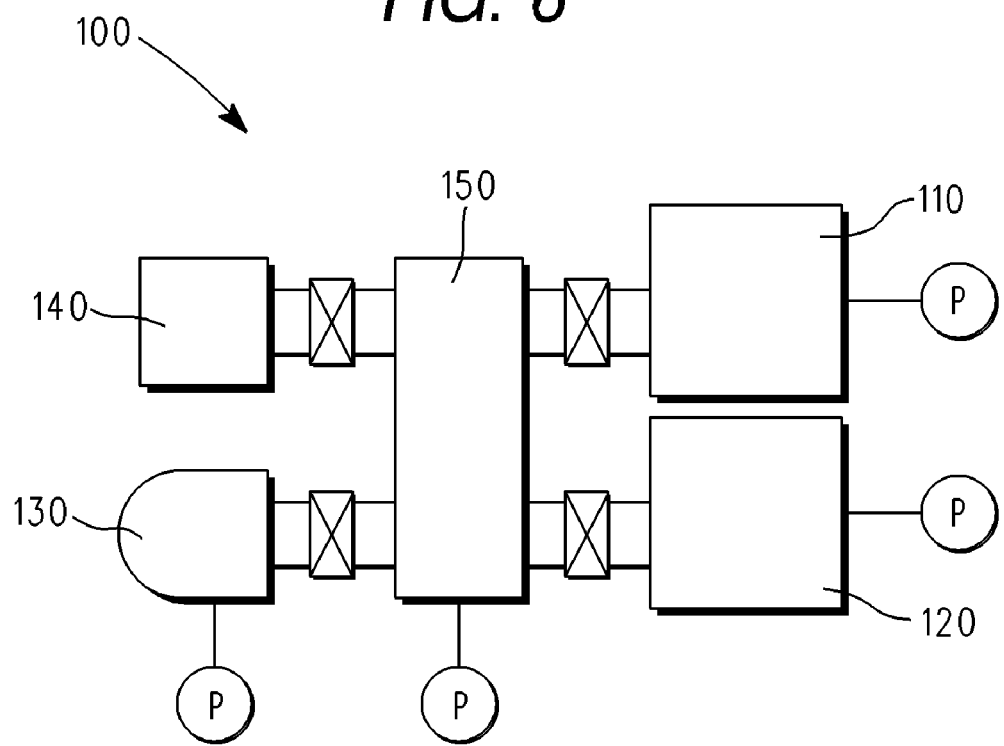
FIG. 6 is a diagram showing a schematic structure of an apparatus for manufacturing the TMR device of the invention.

FIG. 6 shows a schematic structure of an apparatus 100 for manufacturing the TMR device of the invention. As shown in this figure, this apparatus 100 includes sputter chambers 110, 120, an ALD chamber 130, and an oxidizing chamber 140. These chambers are interconnected through a load look chamber 150.

The sputter chambers 110, 120 are for forming the pinned layer 30 by sputtering. More specifically, the sputter chamber 110 is a chamber for forming a thin film of PtMn as the lower pinned layer 31, and the sputter chamber 120 is a chamber for forming a thin film of NiFe as the upper pinned layer 32.

The ALD chamber 130 is a chamber for forming the tunnel barrier layer 40 by the ALD method. The oxidizing chamber 140 is a chamber for oxidizing the formed tunnel barrier layer 40.

The load lock chamber 150 is provided with a transportation mechanism for the substrate 10. For manufacturing the TMR device, the interior of the load lock chamber 150 is maintained under vacuum or in an inert atmosphere.

All the chambers except the oxidizing chamber 140 are provided with a deaerating pump (seen in FIG. 6 as the circled P's), so that the substrate 10 can be transported, by way of the load lock chamber 150, from the sputter chamber 110 to the sputter chamber 120, from the sputter chamber 120 to the ALD chamber 130, and from the ALD chamber 130 to the oxidizing chamber 140 without exposing the substrate 10 to an oxidizing atmosphere.

With the manufacturing apparatus having the above described structure, the cleanliness and interfacial stability of the surface of the pinned layer 30 can be maintained at a high level, because it is possible to shift the substrate 10 from the pinned layer forming process step to the tunnel barrier layer forming process step while keeping the substrate 10 in a vacuum or an inert atmosphere.

As a result, it becomes possible to prevent the surface of the formed pinned layer 30 from being oxidized, thereby avoiding degradation of the performance of the TMR device caused by change in its magnetic effect and occurrence of electric resistance.

Furthermore, with the manufacturing apparatus according to this embodiment, it is possible to promote oxidation of the formed tunnel barrier layer 40, because the ALD chamber 130 is connected to the oxidizing chamber 140 through the load lock chamber 150, and accordingly the substrate 10 can be transported from the ALD chamber 130 to the oxidizing chamber 140 without being exposed to an oxidation atmosphere.

Since the thickness of the tunnel barrier layer 40 is not changed by performing the oxidation promotion by thermal oxidation, plasma oxidation, or ozone oxidation, this embodiment is advantageous in a case where the tunnel barrier layer 40 is made of an oxide or an oxinitride of a metal.

Although the TMR device according to the above described embodiment has a structure including the lower electrode layer 20, pinned layer 30, tunnel barrier layer 40, free layer 50, and upper electrode layer 60 successively formed on the substrate 10, the present invention is applicable to any device including at least the pinned layer, tunnel barrier layer and free layer that provide the tunnel magnetoresistance effect.

In the above embodiment, the tunnel barrier layer is formed by the ALD method which is categorized into the CVD method, however, the tunnel barrier layer may be formed by the thermal CVD method, plasma CVD method, or photo-CVD method.

The TMR device of the invention can be used not only for magnetic sensors but also for MPAMs (magnetoresistive random access memories) and magnetic heads.

The above explained preferred embodiments are exemplary of the invention of the present application which is described solely by the claims appended below. It should be understood that modifications of the preferred embodiments may be made as would occur to one of skill in the art.

What is claimed is:

1. A tunnel magnetoresistance device comprising:
    a pinned layer;
    a tunnel barrier layer formed on said pinned layer; and
    a free layer formed on said tunnel barrier layer, wherein
        said tunnel barrier layer has substantially a stoichiometric composition;
        said tunnel barrier layer is formed from an organic metal as a raw material such that said tunnel barrier layer contains carbon; and
        a concentration of residual carbon in said tunnel barrier layer is lower than 1 atomic %.
2. A tunnel magnetoresistance device according to claim 1, wherein
    said tunnel barrier layer is formed by CVD method.
3. A tunnel magnetoresistance device according to claim 1, wherein
    said tunnel barrier layer is formed by ALD method.
4. A tunnel magnetoresistance device according to claim 1, wherein
    said tunnel barrier layer is a thin film made of at least one of an oxide, a nitride and an oxinitride of a metal or a semiconductor.
5. A tunnel magnetoresistance device according to claim 1, wherein
    said tunnel barrier layer is a thin film made of at least one of oxides of Al, Y, Si, Mg, Ti, Ta, W, Hf and Nb.
6. A tunnel magnetoresistance device according to claim 1, wherein
    said tunnel barrier layer is a thin film made of a nitride of Si.
7. A tunnel magnetoresistance device according to claim 1, wherein
    said tunnel barrier layer is a thin film made of at least one of nitrides of Al, Si, Ti, and Ta.
8. A tunnel magnetoresistance device according to claim 1, wherein
    said tunnel barrier layer is a thin film made of an oxide of Al.
9. A tunnel magnetoresistance device according to claim 8, wherein
    an atomic percentage of oxygen in said tunnel barrier layer is between 52% and 68%.
10. A tunnel magnetoresistance device according to claim 1, wherein
    the raw material is trimethyl aluminum (TMA).
11. A tunnel magnetoresistance device according to claim 1, wherein
    a maximum height of roughness of said pinned layer is larger than 10 nm.
12. A tunnel magnetoresistance device according to claim 1, wherein
    a thickness of said tunnel barrier layer is between 0.5 nm and 5 nm.
13. A tunnel magnetoresistance device according to claim 1, further comprising:
    a substrate,
    a lower electrode layer on which said pinned layer is formed, and
    an upper electrode layer formed on said free layer.
14. A magnetic sensor having a tunnel magnetoresistance device, said tunnel magnetoresistance device comprising:
    a pinned layer;
    a tunnel barrier layer formed on said pinned layer; and
    a free layer formed on said tunnel barrier layer, wherein
        said tunnel barrier layer has substantially a stoichiometric composition;
        said tunnel barrier layer is formed from an organic metal as a raw material such that said tunnel barrier layer contains carbon; and
        a concentration of residual carbon in said tunnel barrier layer is lower than 1 atomic %.
15. A tunnel magnetoresistance device according to claim 14, wherein
    the raw material is trimethyl aluminum (TMA).

* * * * *